(12) United States Patent
Thompson et al.

(10) Patent No.: US 7,202,571 B2
(45) Date of Patent: Apr. 10, 2007

(54) ELECTRONIC MODULE WITH FORM IN-PLACE PEDESTAL

(75) Inventors: Brian D. Thompson, Kokomo, IN (US); Charles I. Delheimer, Noblesville, IN (US); Derek B. Workman, Noblesville, IN (US); Jeenhuei S. Tsai, Carmel, IN (US); Matthew R. Walsh, Sharpsville, IN (US); Scott D. Brandenburg, Kokomo, IN (US)

(73) Assignee: Delphi Technologies, Inc., Troy, MI (US)

( * ) Notice: Subject to any disclaimer, the term of this patent is extended or adjusted under 35 U.S.C. 154(b) by 133 days.

(21) Appl. No.: 10/919,157

(22) Filed: Aug. 16, 2004

(65) Prior Publication Data

US 2006/0033195 A1 Feb. 16, 2006

(51) Int. Cl.
*H01L 23/28* (2006.01)

(52) U.S. Cl. ...................................... 257/787; 257/778

(58) Field of Classification Search ............... 257/787, 257/778
See application file for complete search history.

(56) References Cited

U.S. PATENT DOCUMENTS

| 4,927,697 | A  | * | 5/1990  | Hill  ........................... 428/198 |
| 6,560,122 | B2 | * | 5/2003  | Weber ......................... 361/783 |
| 6,651,320 | B1 |   | 11/2003 | Yagi et al. |
| 2003/0189243 | A1 |   | 10/2003 | Jiang et al. |

FOREIGN PATENT DOCUMENTS

EP      1519641      3/2005

* cited by examiner

*Primary Examiner*—Mark V. Prenty
(74) *Attorney, Agent, or Firm*—Jimmy L. Funke

(57) ABSTRACT

An electronic module includes a substrate, at least one surface mounted integrated circuit (IC) component and an underfill material. The substrate includes a plurality of electrically conductive traces, formed on at least one surface of the substrate, and the component is electrically coupled to at least one of the conductive traces. The underfill material is positioned between the component and the substrate and provides at least one pedestal that supports the component during encapsulation. The underfill material, when cured, maintains the integrity of the electrical connections between the component and the conductive traces.

15 Claims, 1 Drawing Sheet

ELECTRONIC MODULE WITH FORM IN-PLACE PEDESTAL

TECHNICAL FIELD

The present invention is generally directed to an electronic module and, more specifically, to an electronic module that includes a form in-place pedestal.

BACKGROUND OF THE INVENTION

Electronic modules have been widely utilized in the automotive industry and may take various forms, such as an all silicon ignition (ASI) module implemented in a TO247 package. Typically, such electronic modules have been encapsulated, e.g., with an epoxy-molding compound, to seal the electronic components of the module from the environment. Unfortunately, during the overmolding process, it is common for stress to be applied to solder joints, which attach an electronic component, e.g., an integrated circuit (IC) die, to conductive traces formed on a surface of a substrate. That is, the solder joints that electrically connect the die to the substrate are subject to compression during overmolding, which can result in electrical shorts. A high-pressure area between the bottom of the die surface and the top of the substrate surface during the overmolding process may also create a tensile stress at the solder bumps, which can result in solder joint failure. Further, in certain situations, stress applied to the die can cause the solder joints to compress and prevent an overmold material from completely underfilling the IC.

What is needed is a technique that prevents damage of surface mount component solder connections of an electronic module during an overmolding process. It would also be desirable if the technique readily facilitated the flow of an overmold material around the solder connections and between the surface mount components (i.e. flip chip, BGA or other IC packages) and its associated substrate.

SUMMARY OF THE INVENTION

The present invention is directed to an electronic module that includes a substrate, at least one surface mounted integrated circuit (IC) component and an underfill material. The substrate includes a plurality of electrically conductive traces, formed on at least one surface of the substrate, and the component is electrically coupled to at least one of the conductive traces. The underfill material, e.g., a support dot, is positioned between the component and the substrate and provides at least one pedestal that supports the component during encapsulation. The underfill material, when cured, maintains the integrity of the electrical connections between the component and the conductive traces.

According to another aspect of the present invention, the electronic module includes an electrically non-conductive overmold material that encapsulates the component, the underfill material and at least a portion of the substrate. According to one embodiment, the overmold material is an epoxy-molding compound. According to another aspect of the present invention, the underfill material does not flow during a solder reflow process that electrically couples the component to one or more of the traces. According to this aspect of the present invention, the underfill material solidifies during the solder reflow process. The thickness of the underfill material closely matches the standoff height of the component (i.e., the distance between the bottom of the component and the top of the substrate) and has a diameter between about 20 and 100 mils. The underfill material support dot may be dispensed on the substrate prior to a solder paste printing or the underfill material may be applied to the component. It should be appreciated that the present invention is directed to a wide variety of substrates, such as ceramic substrates and printed circuit boards (PCBs).

According to another aspect of the present invention, a technique for manufacturing an electronic module is disclosed herein. According to this method, a substrate including a plurality of electrically conductive traces, formed on at least one surface of the substrate, is provided. Also, at least one surface mount integrated circuit (IC) component is provided. An underfill material is deposited on at least one of the component and the substrate. The component is electrically coupled to at least one of the conductive traces and the underfill material, when cured, provides at least one pedestal positioned between the component and the substrate. The component, the underfill material and at least a portion of the substrate are then encapsulated with an electrically non-conductive overmold material. The pedestal supports the component during encapsulation, allowing the overmold material to underfill the component and maintain the integrity of the electrical connections between the component and the traces.

These and other features, advantages and objects of the present invention will be further understood and appreciated by those skilled in the art by reference to the following specification, claims and appended drawings.

BRIEF DESCRIPTION OF THE DRAWINGS

The present invention will now be described, by way of example, with reference to the accompanying drawings, in which.

DESCRIPTION OF THE PREFERRED EMBODIMENTS

In spite of the standardized manufacturing processes utilized to assemble electronic modules, various components, such as a solder attachment point, wire bonds and the molding compound, have exhibited negative characteristics, e.g., solder joint cracking, wire bond failure and delamination, respectively. It should be appreciated that these failures may seriously compromise the robustness and long-term reliability of the module. At the very least, such failure causes severe performance degradation and may also result in complete field failures of the module.

Figure 1:
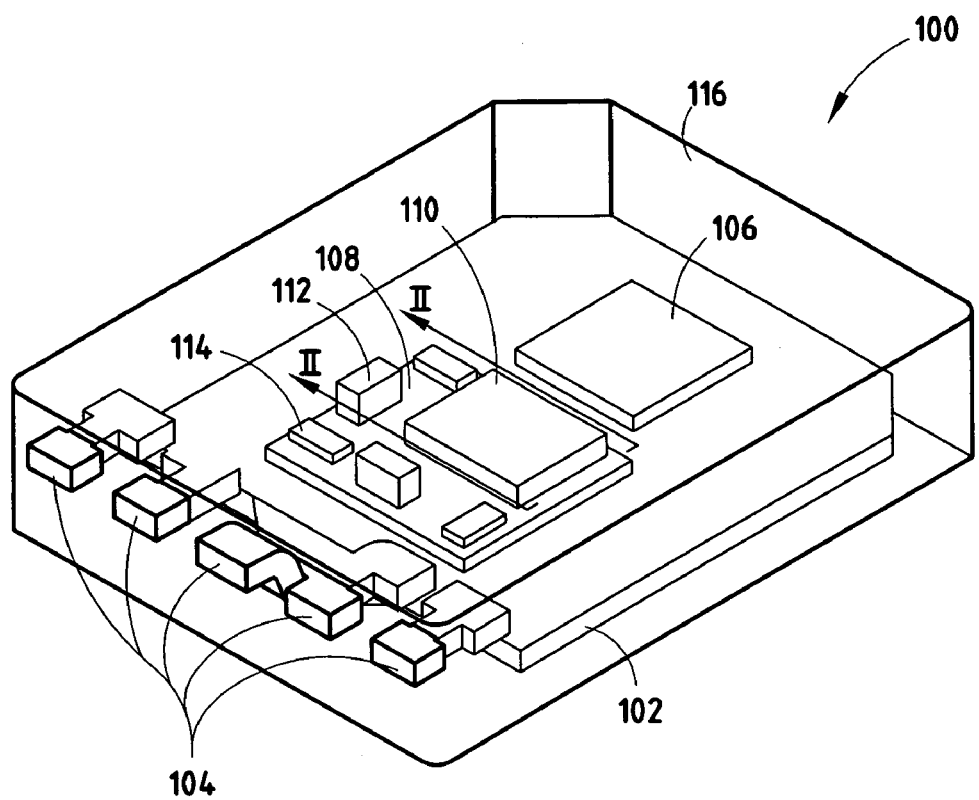
FIG. 1 is a perspective view of an exemplary overmolded electronic module configured according to one embodiment of the present invention.

FIG. 1 depicts an exemplary electronic module 100 that includes an electrically conductive tab/header or base plate 102 that may act as a ground plane and be connected to one or more of a plurality of conductive lead pins 104. An electronic component 106, e.g., an integrated circuit (IC) die, that includes circuitry to implement a transistor, such as an insulated gate bipolar transistor (IGBT), may be configured such that a drain of the transistor is brought out on a face of the die 106 coupled to the base plate 102. In this configuration, a gate and source of the transistor are brought out on a face of the die 106 opposite the drain. A substrate 108, such as an alumina substrate, may provide interconnecting paths for a plurality of electronic components, such as a chip capacitor 112 and an application specific integrated circuit (ASIC) 110, and may also provide bond pads 114 for coupling the various associated components of the substrate 108 to one or more of the lead pins 104 and/or to circuitry integrated within the die 106. In a typical such assembly, the electronic components are encased in an epoxy-molding compound 116. The epoxy-molding compound may serve to seal the electronic components from the environment and may also be utilized to better match a coefficient of thermal expansion (CTE) of the various components located within the assembly 100.

Figure 2:
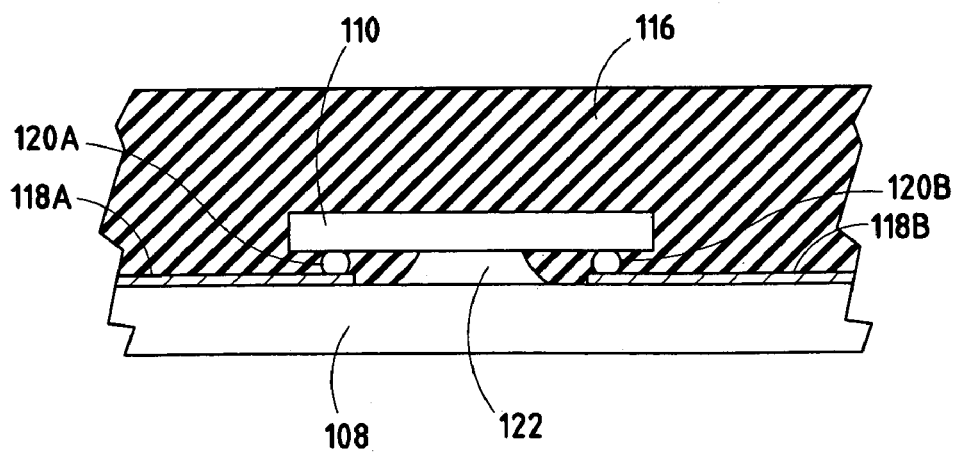
FIG. 2 is a cross-sectional view of a portion of the module of FIG. 1, depicting a form in-place pedestal, which supports the form in-place pedestal positioned between an integrated circuit (IC) die and its associated substrate.

With reference to FIG. 2, a partial cross-sectional view of the module 100 of FIG. 1 is further depicted. As is shown, an overmold material 116 encapsulates the integrated circuit (IC) 110 and at least a portion of the substrate 108. The IC 110 is electrically coupled to traces 118A and 118B associated with the substrate 108 by solder bumps 120A and 120B, respectively. As is shown in FIG. 2, a form in-place pedestal 122 is positioned between the substrate 108 and the IC 110. The substrate 108 may take a variety of forms, such as a ceramic substrate and/or a printed circuit board (PCB) formed, for example, from a material, such as FR4. The IC 110 may be, for example, a flip chip or other surface mount technology (SMT) device. The underfill material, which forms the pedestal 122, may take a variety of shapes and/or sizes. For example, the underfill material may take the form of a cylinder having a height that closely matches the stand-off height of the component (i.e., the distance between the bottom of the component and the top of the substrate) and a diameter between about 20 and 100 mils. It should be appreciated that the underfill material may be dispensed on the substrate 108 before or after a solder paste printing operation utilized to form the solder bumps 120A and 120B.

Alternatively, the underfill material may be applied directly to a surface of the component 110. The overmold material 116 may be, for example, an epoxy molding compound. According to the present invention, the underfill material is selected so as to not flow during a solder reflow process that electrically couples the component 110 to one or more of the traces 118A and 118B of the substrate 108. The underfill material may be selected, such that it solidifies during the solder reflow process. It should be appreciated that the support 122 formed between the substrate 108 and the component 110 prevents overmold pressure from collapsing the solder bumps 120A and 120B. It should be appreciated that a wide variety of no-flow underfill materials will function for this application.

In various embodiments, the support 122 is formed during reflow operations, such that the die of the component 110 is allowed to float on solder and the joints are formed prior to the support solidifying. Thus, no stress is placed on the component 110 by the support 122 during die placement and solder reflow. As such, the support 122 does not damage circuitry of the component 110. Further, as previously discussed, forming a support 122 in this manner with a no-flow underfill material prevents damage to the solder bumps 120A and 120B. Additionally, the pedestal 122 allows the flow of an overmold material around the bumps 120A and 120B and under the component 110. Thus, during typical molding conditions, e.g., 600 psi transfer pressure and 600 psi packing pressure, with a various molding compounds, a pedestal provided according to the present invention prevents damage to the die circuitry, as well as solder joints, while allowing underfill material to freely flow between the die and the substrate and around the solder bumps.

The above description is considered that of the preferred embodiments only. Modifications of the invention will occur to those skilled in the art and to those who make or use the invention. Therefore, it is understood that the embodiments shown in the drawings and described above are merely for illustrative purposes and not intended to limit the scope of the invention, which is defined by the following claims as interpreted according to the principles of patent law, including the doctrine of equivalents.

The invention claimed is:

1. An electronic module, comprising:
   a substrate including a plurality of electrically conductive traces formed on at least one surface of the substrate;
   at least one surface mounted integrated circuit (IC) component, wherein the component is electrically coupled to at least one of the conductive traces; and
   an underfill material positioned between the component and the substrate, the underfill material when cured providing at least one pedestal that supports the component during encapsulation while maintaining the integrity of electrical connections between the component and the conductive traces, wherein a thickness of the underfill material closely matches a stand-off height of the component and a diameter of the underfill material is between about 20 and 100 mils.

2. The module of claim 1, further including:
   an electrically non-conductive overmold material encapsulating the component, the underfill material and at least a portion of the substrate.

3. The module of claim 2, wherein the overmold material is an epoxy-molding compound.

4. The module of claim 1, wherein the underfill material does not flow during a solder reflow process that electrically couples the component to one or more of the traces.

5. The module of claim 4, wherein the underfill material solidifies during the solder reflow process.

6. The module of claim 1, wherein the substrate is a ceramic substrate.

7. The module of claim 1, wherein the component is a flip-chip.

8. The module of claim 1, wherein the underfill material is dispensed on the substrate.

9. The module of claim 8, wherein the underfill material is dispensed on the substrate prior to solder paste printing.

10. The module of claim 1, wherein the underfill material is applied to the component.

11. The module of claim 1, wherein the substrate is a printed circuit board (PCB).

12. An electronic module, comprising:
    a substrate including a plurality of electrically conductive traces formed on at least one surface of the substrate;
    at least one surface mounted integrated circuit (IC) component, wherein the component is electrically coupled to at least one of the conductive traces;
    an underfill material positioned between the component and the substrate, the underfill material when cured providing at least one pedestal that supports the component during encapsulation while maintaining the integrity of electrical connections between the component and the conductive traces; and
    an electrically non-conductive overmold material encapsulating the component, the underfill material and at least a portion of the substrate, wherein a thickness of the underfill material closely matches a stand-off height of the component and a diameter of the underfill material is between about 20 and 100 mils.

13. The module of claim 12, wherein the overmold material is an epoxy molding compound.

14. The module of claim 12, wherein the underfill material does not flow during a solder reflow process that electrically couples the component to one or more of the traces, and wherein the underfill material solidifies during the solder reflow process.

15. The module of claim 12, wherein the substrate is a ceramic substrate and the component is a flip-chip.

* * * * *